(12) United States Patent
Coulman et al.

(10) Patent No.: US 6,294,929 B1
(45) Date of Patent: Sep. 25, 2001

(54) BALANCED-DELAY PROGRAMMABLE LOGIC ARRAY AND METHOD FOR BALANCING PROGRAMMABLE LOGIC ARRAY DELAYS

(75) Inventors: Paula Kristine Coulman; Sang Hoo Dhong; Jaehong Park, all of Austin; Stephen Douglas Posluszny; Osamu Takahashi, both of Round Rock, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,205

(22) Filed: Nov. 18, 1999

(51) Int. Cl.[7] .......................... H03K 19/177; H03H 11/26
(52) U.S. Cl. .............................. 326/41; 326/47; 327/276
(58) Field of Search ................... 326/41, 47, 38, 326/39; 327/276, 281, 272, 270

(56) References Cited

U.S. PATENT DOCUMENTS

| 4,600,995 | * | 7/1986 | Kinoshita | 716/17 |
| 5,239,213 | * | 8/1993 | Norman et al. | 326/38 |
| 5,283,631 | * | 2/1994 | Koerner et al. | 326/121 |
| 5,841,296 | * | 11/1998 | Churcher et al. | 326/49 |
| 6,008,666 | * | 12/1999 | Conn | 326/39 |
| 6,060,930 | * | 5/2000 | Choi | 327/276 |
| 6,150,863 | * | 11/2000 | Conn et al. | 327/270 |

FOREIGN PATENT DOCUMENTS

358200569A * 11/1983 (JP).

* cited by examiner

Primary Examiner—Michael Tokar
Assistant Examiner—James H. Cho
(74) Attorney, Agent, or Firm—Casimer K. Salys; Bracewell & Patterson, L.L.P.

(57) ABSTRACT

Balanced-delay programmable logic array and a method for balancing programmable logic array delays provide improved performance in circuits employing programmable logic. By adding transistors to the programming plane that do not form part of the logic implementation, the capacitance on each of the input logic lines can be balanced, substantially reducing the skew between signals entering the final logic gates. This provides programmable logic arrays that may implement asynchronous logic in applications where skew was previously prohibitive and further increases the reliability of state evaluations in synchronous logic.

25 Claims, 9 Drawing Sheets

BALANCED-DELAY PROGRAMMABLE LOGIC ARRAY AND METHOD FOR BALANCING PROGRAMMABLE LOGIC ARRAY DELAYS

BACKGROUND OF THE INVENTION

1. Field of the Invention

The present invention generally relates to programmable logic arrays, and more particularly to high speed programmable logic arrays having reduced delay or skew effects.

2. Description of the Related Art

Logic circuits, particularly those used to simultaneously evaluate an equation with a large number of inputs have been implemented in a variety of architectures. A programmable logic array (PLA) is an integrated circuit device that incorporates fixed sets of AND and OR logic gates or similar functions such as NAND, NOR, XOR or XNOR with one or more interconnect planes used to create several logical combinatorial outputs from several logical inputs. The interconnect planes in a mask programmable logic array are usually metallization layers that can be redesigned and deposited during a production run without redesigning the semiconductor layers of the device. The depositing of the mask can be performed by vapor deposition of aluminum or other metals using techniques well known in the art. The mask connects devices within an interconnect array or "plane" comprising two sets of conductors, a set of logic inputs and a set of logic gate inputs. The sets of conductors are coupled together with devices that create a logic contribution from the logic inputs to the logic gate inputs. Fuse programmable logic arrays allow programming of the device after manufacture by using a programming or appropriate in-circuit electronics to allow programming of the device.

In high speed logic, particularly asynchronous logic where combinatorial outputs are not clocked, it is desirable to eliminate device skew. Device skew is the differential delay between the logical inputs from which the combinatorial outputs are produced. In asynchronous logic, an output is valid only after all of the inputs that form part of the logic equation have propagated through the gates to the output. In synchronous logic, the maximum clocking rate of the device is set by the validity of the combinatorial input to the latch, which is determined by the time it takes for all of the inputs to propagate to the input of the register latching the output. Device skew is undesirable in that a period of uncertainty exists from the time that the fastest logic input asserts an effect on the output to the time that the slowest logic input asserts its affect on the output. If device skew is too great, the use of PLA's may not be practical in certain high-speed circuits, or may lead to improper operation of the PLA.

Circuits using asynchronous or synchronous logic with low device skew can be optimized to consider device delay as part of the overall logic path, since the period of uncertainty is low. On the other hand, circuits with high device skew are less useful in that the period of uncertainty produces an invalid result for that period, making the output unusable as a prior state or a new state for that period of time.

The advantages of using programmable logic arrays include mask reprogrammability, which allows redesign of just the metal mask, and reusability, in that the same programmable logic semiconductor layer design can be used repeatedly to support an unlimited number of designs.

But, programmable logic arrays, especially those implemented in dynamic logic, have device skews that are typically variable and can be quite high. The device skew depends on the particular logic equations being implemented for a given combinatorial logic output and vary from output to output causing output skew which is another similar problem burdening the use of PLA's, as the outputs of the device will not be valid at the same time, further increasing the difficulties of incorporating PLA's in asynchronous circuit design.

It would therefore be desirable to improve mask programmable logic arrays and other topologies so that device skew and output skew can be reduced or eliminated. It would be further desirable to improve the topologies in such a way that the mask layer can be changed without increasing device skew.

SUMMARY OF THE INVENTION

It is therefore one object of the present invention to provide an improved programmable logic array (PLA) with reduced device skew.

It is another object of the present invention to provide such a PLA having reduced skew.

It is yet another object of the present invention to provide a programmable logic array with reduced device skew that is reprogrammable without a semiconductor layer redesign.

The foregoing objects are achieved in an a method for balancing delays in a programmable logic array and a programmable logic array wherein the input loads due to connection devices are equalized. The method determines if an input line to the programming array has a greater number of devices connected that contribute to the logic equation being produced than the number of devices connected to the other input lines, and adds loading devices to the other input lines until the number of connected devices, or the loading is equal. The programmable logic array can be designed so that all connection points are populated and the loading devices can be added by redesigning a mask layer. The connection devices can be transistors with gates coupled to the logic input lines and a channel connection coupled to the logic plane signal lines. The loading devices can be transistors with gate coupled to the logic input lines and both drain and source coupled to ground or a power plane. Logic OR or logic AND planes can be enhanced by these techniques and both may be used in a single device for flexibility. The method may add connection devices incrementally, or the number of devices to add may be calculated by knowing the most loaded logic input line. The technique may be applied to field programmable logic arrays or other similar devices and the method may be embodied in a computer program product for designing masks or programming devices.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like numbers correspond to like elements and further:

DETAILED DESCRIPTION OF THE ILLUSTRATIVE EMBODIMENTS

Figure 1:
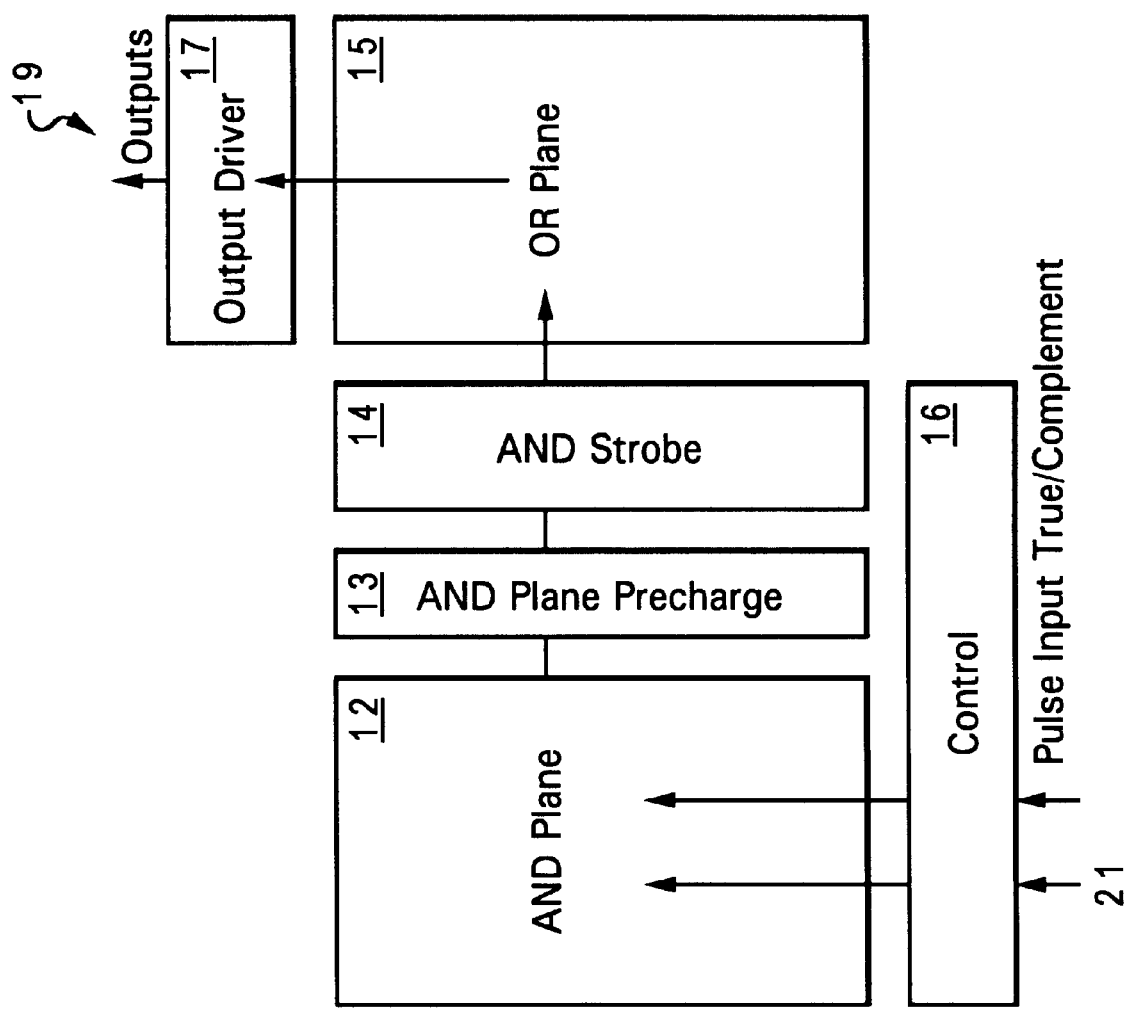
FIG. 1 is a high level block diagram of a programmable logic array in which the present invention may be practiced.

With reference now to the figures, and in particular with reference to FIG. 1, there is depicted a programmable logic array in which the present invention may be practiced. Control 16 receives the input signals which are designated as pulse input true/complement signals 21. These are complementary pairs of signals provided to AND plane 12 which has a pair of complementary inputs on each AND gate contained in AND plane 12. AND plane precharge 13 provides precharge current to AND plane 12. The exemplary logic array is a dynamic logic array, but the application of the present invention is not limited to dynamic logic.

Interconnection within AND plane 12 is embodied in a metal layer, while interconnect devices are embodied in semiconductor layers. This provides that the device may be reprogrammed by redesign of the mask, rather than all of the layers of the integrated circuit. The mask may be a vapor deposited metal layer providing metallic connections between devices created in semiconductor layers of the PLA integrated circuit.

AND strobe 14 completes the logic output of the AND plane 12 and connects to OR plane 15. OR plane 15 comprises single line inputs to the interconnect array, rather than complementary inputs as provided by AND plane 12. This is exemplary and does not limit the application of the present invention to a device with any combination of logic cells at the output of an interconnect matrix.

The essence of the present invention is the manner in which the matrix is interconnected, and in some embodiments, the presence of devices at each of the interconnect points available for use as balance cells or logic contribution cells that would typically be missing from programmable logic arrays.

OR plane 15 takes the logic outputs of AND plane 12 and creates the final combinatorial outputs 19 for the programmable logic array, which are provided through output driver 17.

Figure 2:
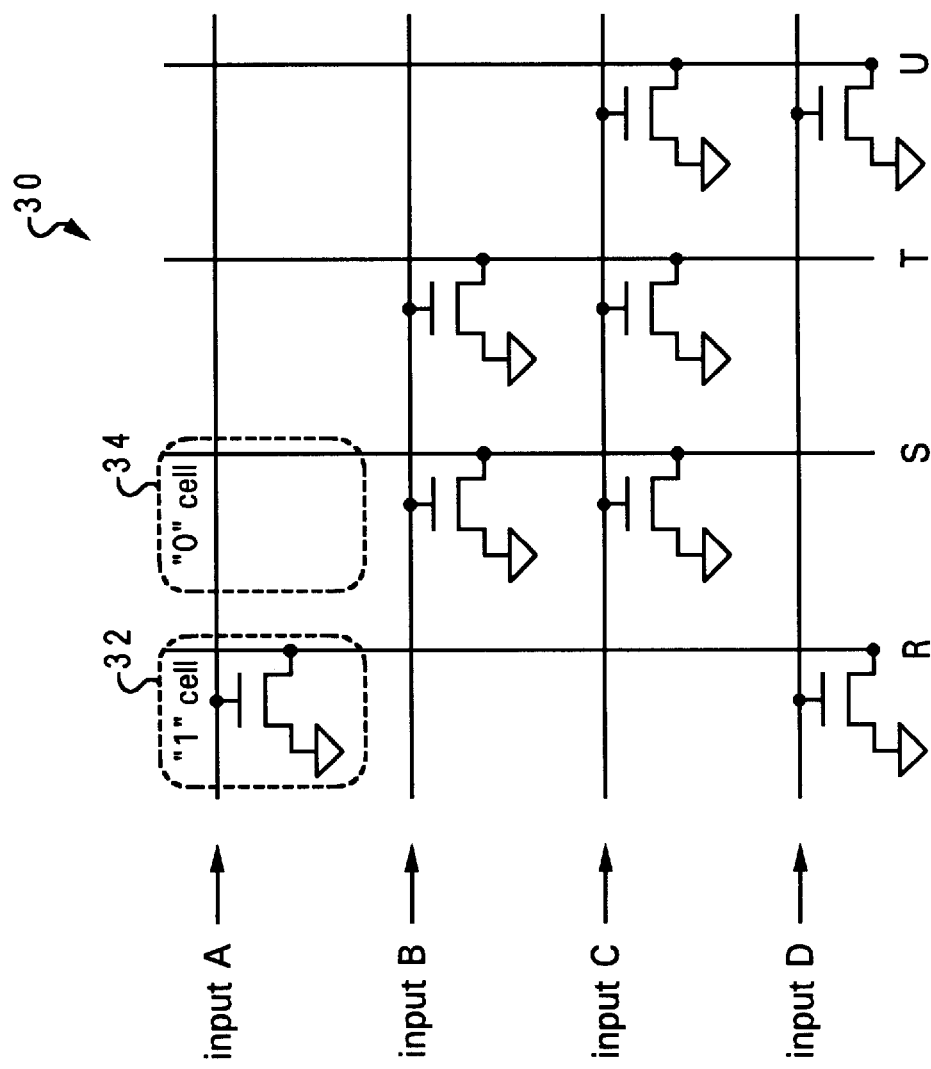
FIG. 2 is a simplified electrical schematic diagram of a prior art interconnect plane to which the method of the invention may be applied.

Referring now to FIG. 2, a prior art interconnect scheme for a single output line interconnect matrix 30 is shown. Matrix 30 is shown with four logical inputs A–D and four logic gate output lines R–U. A logical "1" contribution to the logic output is made with a "1" cell 32 and a logical "0" contribution is made with a "0" cell 34. "1" cells and "0" cells are placed to achieve the desired combinatorial result.

Outputs R–U are complements of the logic equation, since the operation of the device in the "1" cell for a logical high input will result in the logic gate input line being pulled low due to conduction of the NMOS transistor. The logic implemented by this interconnect matrix or "plane" is R=!(A+D), S=!(B+C), T=!(B+C), and U=!(C+D), where "+" indicates a logical OR operation and "!" indicates the logical complement (NOT) operation. Thus a "1" cell indicates a contribution to the OR equation and a "0" cell indicates no contribution. This interconnect scheme suffers from skew caused by variable loading of input lines A–D. As depicted in the figure, input A has one device load, input B two, input C three and input D two. The layout and connection of interconnect planes and the logic gates to which they are connected is generally uniform. The skew due to the logic planes within the device is caused by this differential variable loading of the input lines.

Figure 3:
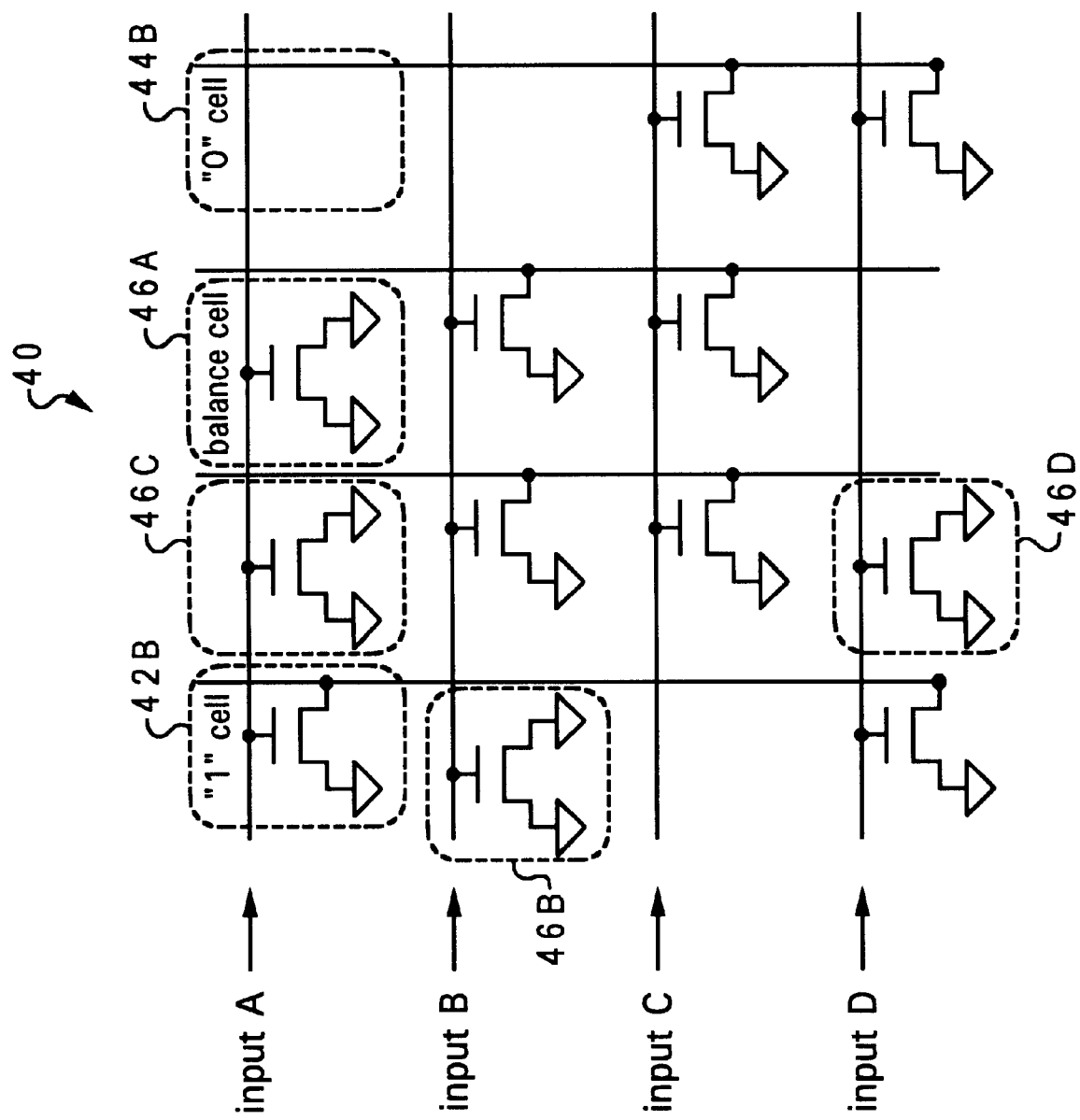
FIG. 3 is a simplified electrical schematic diagram of an interconnect plane in accordance with an embodiment of the invention.

Referring now to FIG. 3, an interconnection of plane 40 is shown in accordance with a first embodiment of the invention. Balance cells 46A and 46C have been added to input line A, giving input line A three device loads. Since the gate capacitance of the NMOS transistor in balance cells 46 is equal to the gate capacitance of a "1" cell, the delay of line A and the delay of line C will now be equal and the device skew will be reduced. For example, in a modern high speed PLA, the delay due to one gate capacitance can be on the order of tens of picoseconds. When many logic gate inputs are provided and connected, the total skew may approach a nanosecond which is on the order of a clock cycle for present processing systems. Logic inputs B and D have been similarly treated. Balance cell 46B has been added to input B to bring its device load to 3, and balance cell 46D has been added to input D, likewise.

The method of the present invention may calculate the difference between the device loading of the most loaded logic input line and the other logic input lines and add balance cells to make all of the device loads equal, or it may incrementally add balance cells until the device loads are equal.

Figure 4:
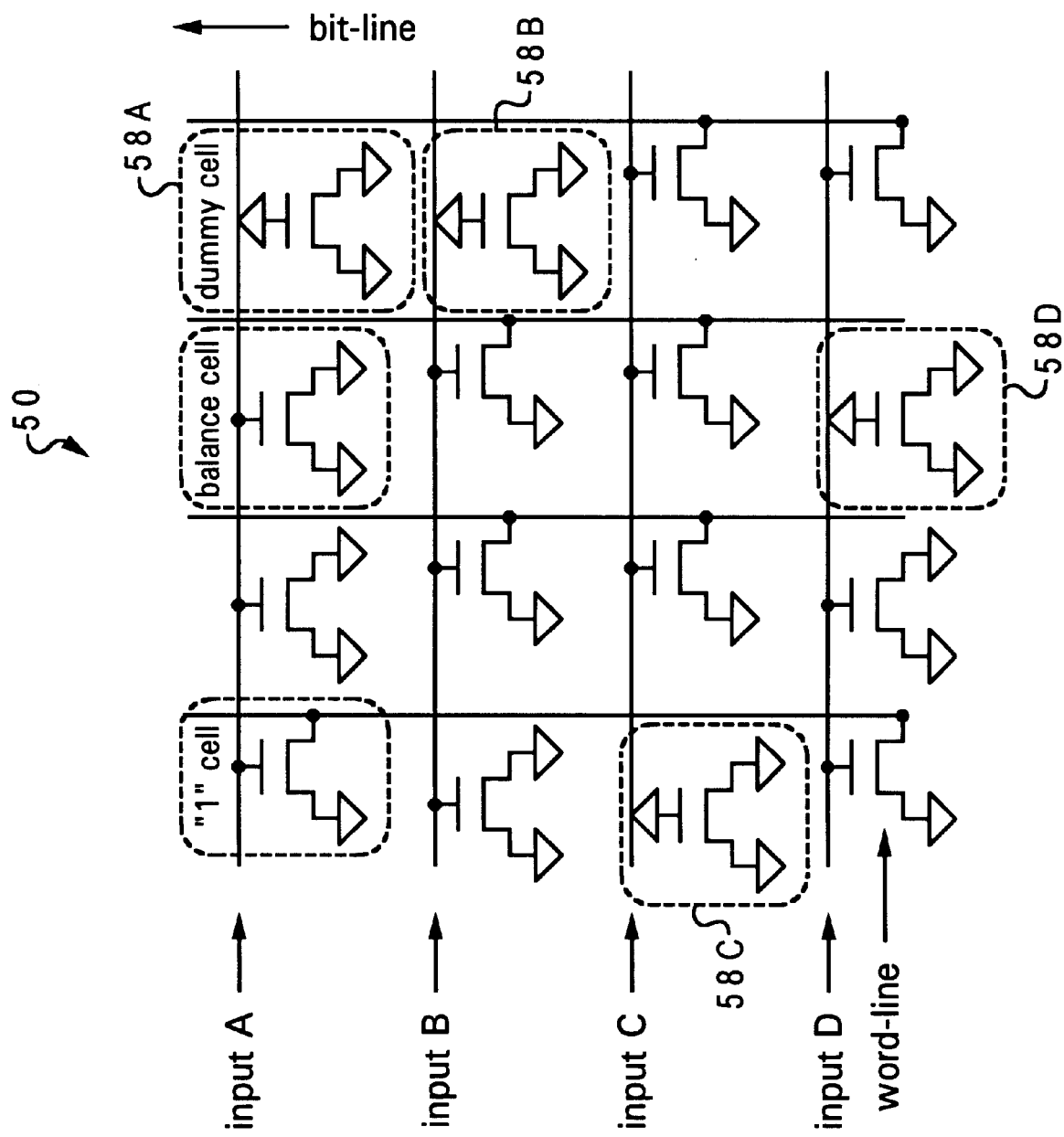
FIG. 4 is a simplified electrical schematic diagram of an interconnect plane in accordance with a second embodiment of the invention.

Referring now to FIG. 4, a second embodiment of the present invention is shown. In this embodiment, plane 50 is fully populated. This embodiment is consistent with the object that the device may be reprogrammed and the device skew "balanced" without redesign of the semiconductor layers. By providing a device at each interconnect junction, the mask layer may be redesigned to provide a different connection of the NMOS transistors shown in the figure. Dummy cell 58 is a transistor that is not contributing to the device logic and is further not loading the logic input lines, as all terminals are connected to ground. This enhances the noise immunity and reliability of the device and is not a necessary connection. Any or all terminals may be left floating and achieve the same result. Balance cells are present as in FIG. 2, but now if the logic is redesigned by redesigning or "reprogramming" of the mask, the gate of the dummy cell may be connected to the logic input line to insert a balance cell, and the balance cell converted to a "1" cell by connecting a channel terminal of the transistor to the logic gate input line.

Figure 5:
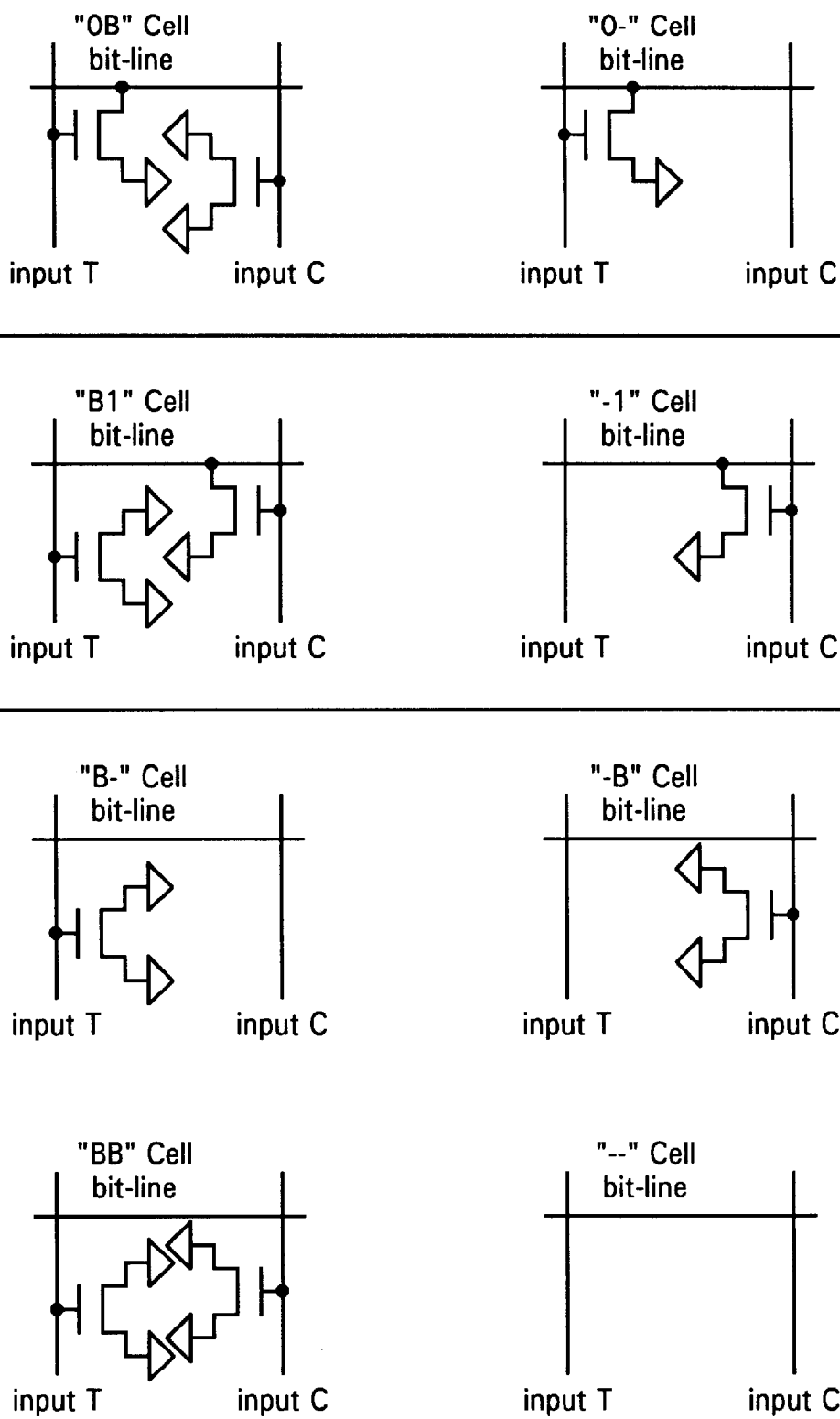
FIG. 5 is a pictoral diagram depicting interconnect cells in accordance with a third embodiment of the invention.

Referring now to FIG. 5, a set of cells for use with complementary input logic as in AND plane 12 is depicted. Conceptually, each complementary logic gate input line can be balanced individually, but it is useful to define a set of cells with a particular effect and device loading with which to implement combinatorial logic. Input lines are labelled "T" and "C" for true and complement, respectively.

"OB" cell produces a zero logic contribution to the AND equation and is balanced for the complementary pair (Each of the complementary logic gate input lines receives a device loading of 1 from this cell.) The "0-" cell likewise has a zero logic contribution, but is missing a device load on the complementary line. The "B1" cell produces a logic one contribution to the AND equation and has the balanced characteristic. "-1" produces a logic one contribution and is missing a device load on the true line. Thus, a "0-" cell connecting a logic input to one logic gate input line will balance a "-1" cell. It is not necessary to balance all cells individually and is undesirable as the increase in total device load due to placing all balanced cells would cause an increase in overall device delay. The remaining cells are "don't care" cells that cause the inputs not to contribute to the logic equation, but are used for balancing device skew. "B-" is a balance cell that can likewise balance a "-1" cell and "-B" is a balance cell that can balance a "0-" cell. "BB" is a balance cell that can be used to increase the device count of both complementary lines to adjust the device count against other pairs of complementary input lines. "—" cell is a typical don't care cell as found in the prior art.

Figures 6A, 6B:
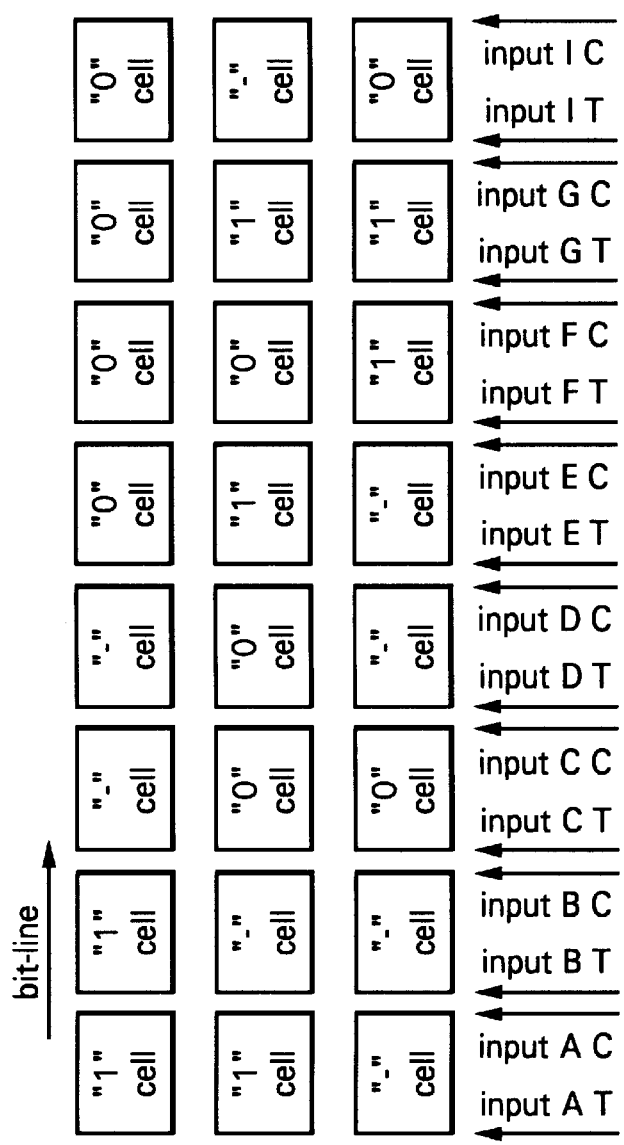
FIG. 6A is a connection table depicting the logic equation of FIGS. 6B, 7, 8, and 9.
FIG. 6B is a prior art cell map showing cells placed in accordance with the table of FIG. 6A.

Referring now to FIG. 6B, a prior art complementary logic cell placement is shown that implements the logic depicted in FIG. 6A. A "1" indicates a true contribution, a "0" a complement contribution and a "-" a "don't care" with respect to that logic input. Thus the first row cell placement in FIG. 6B implements A·B·!E·!F·!G·!I, where "·" indicates a logical AND operation and "!" indicates the logical complement (NOT) operation. The second row implements A·!C·!D·E·!F·G, and the third row !C·F·G·!I. The "-" cells depicted are the "—" cells of FIG. 5, the "1" cells the "-1" cells of FIG. 5, and the "0" cells the "0-" cells of FIG. 5. They are unbalanced cells and therefore input A has a device load of 2 on the true line (AT) and a device load of 0 on the complement line (AC). Input B has a device load of 1 on the true line and 0 on the complement line, et cetera. Within the entire plane, the maximum device load is 2 for the complement (inputs C, F, and I) and 2 for the true (inputs A and G).

Figure 7:
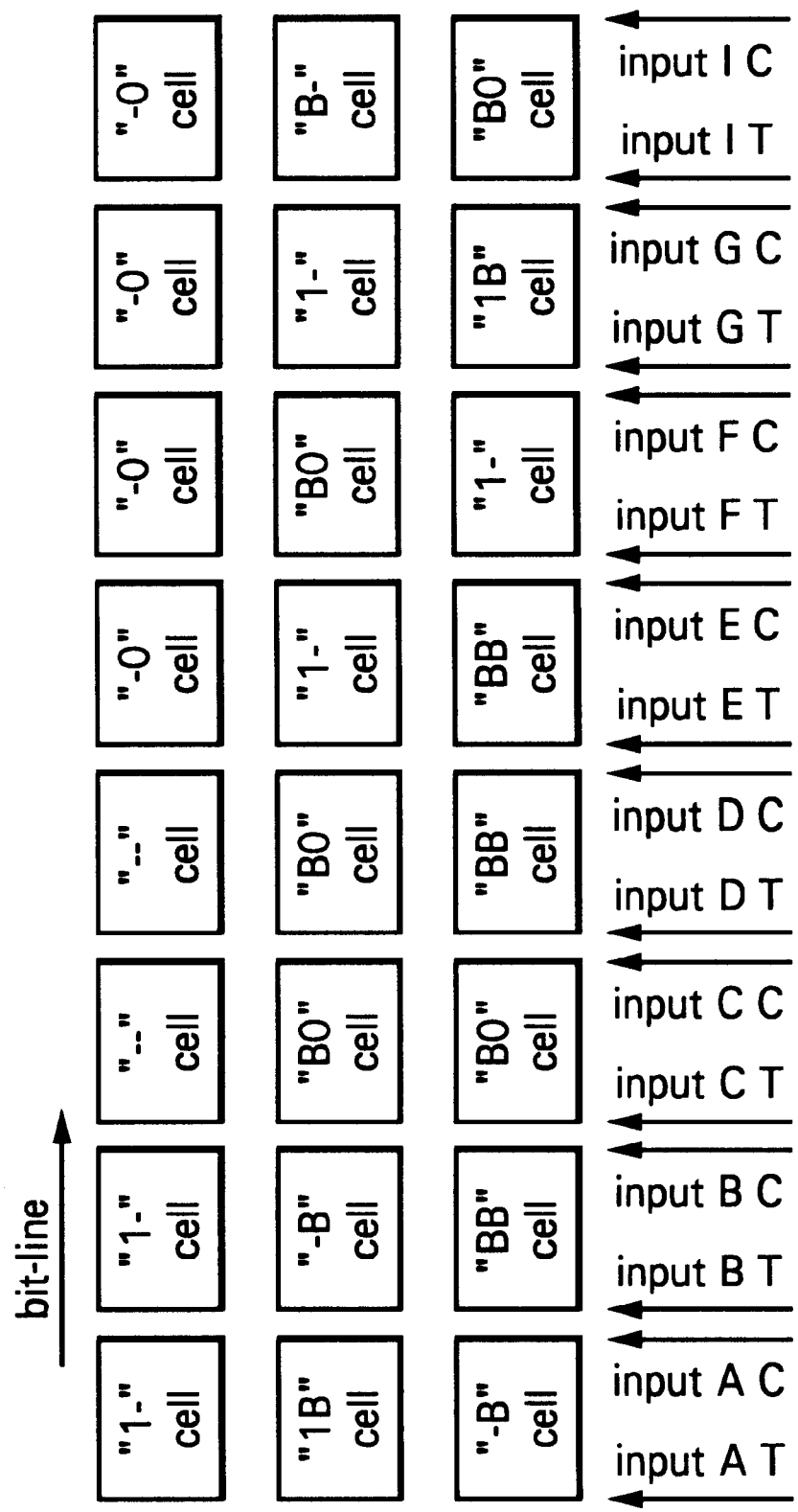
FIG. 7 is a cell map showing cells placed in accordance with a third embodiment of the invention.

Referring now to FIG. 7, the balance cells of FIG. 5 are applied to the logic of FIG. 6A to produce a cell map with a balanced device load on each of the logic inputs. Starting with the bottom row, balance cells are added until the device load is equal to 2 for each of the true and complement inputs. Thus, input AT does not receive any balance cells, but input AC receives balance cells "-B" to maintain the "don't care" condition on the bottom row, and "1B" to maintain the true contribution of input AT.

Figure 8:
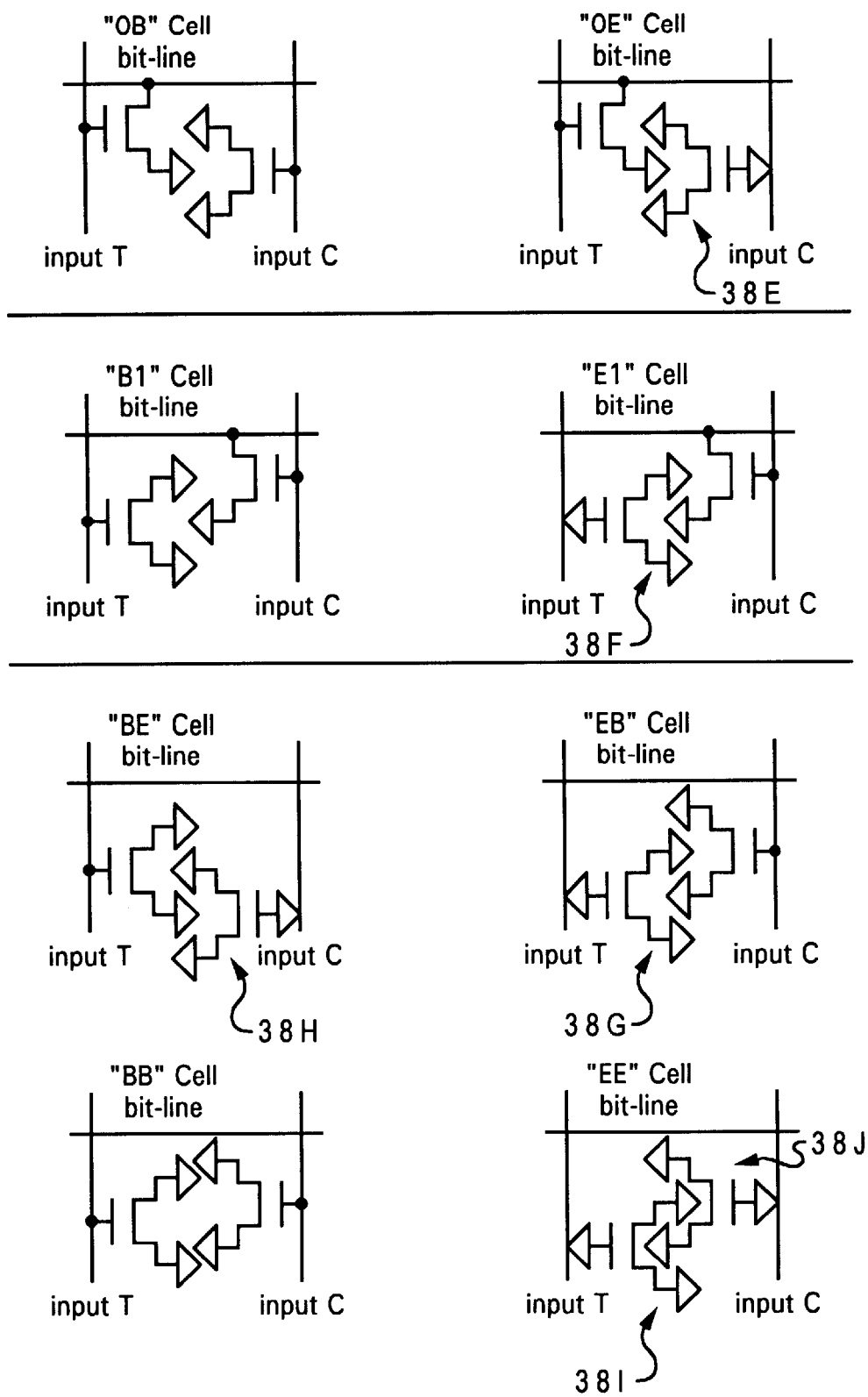
FIG. 8 is a pictoral diagram depicting interconnect cells in accordance with the fourth embodiment of the invention.

Referring now to FIG. 8, a set of cells in accordance with a fourth embodiment of the invention is depicted. As in the second embodiment, these cells are fully populated in that they contain a device at each interconnect point. Thus dummy cells 38 have been added to each of the cells that did not already contain two transistors. Now if the logic is redesigned by redesigning or "reprogramming" of the mask, the gate of the dummy cell may be connected to the logic input line to insert a balance cell, and the balance cell converted to a contributing cell by connecting a channel terminal of the transistor to the logic gate input line.

Figure 9:
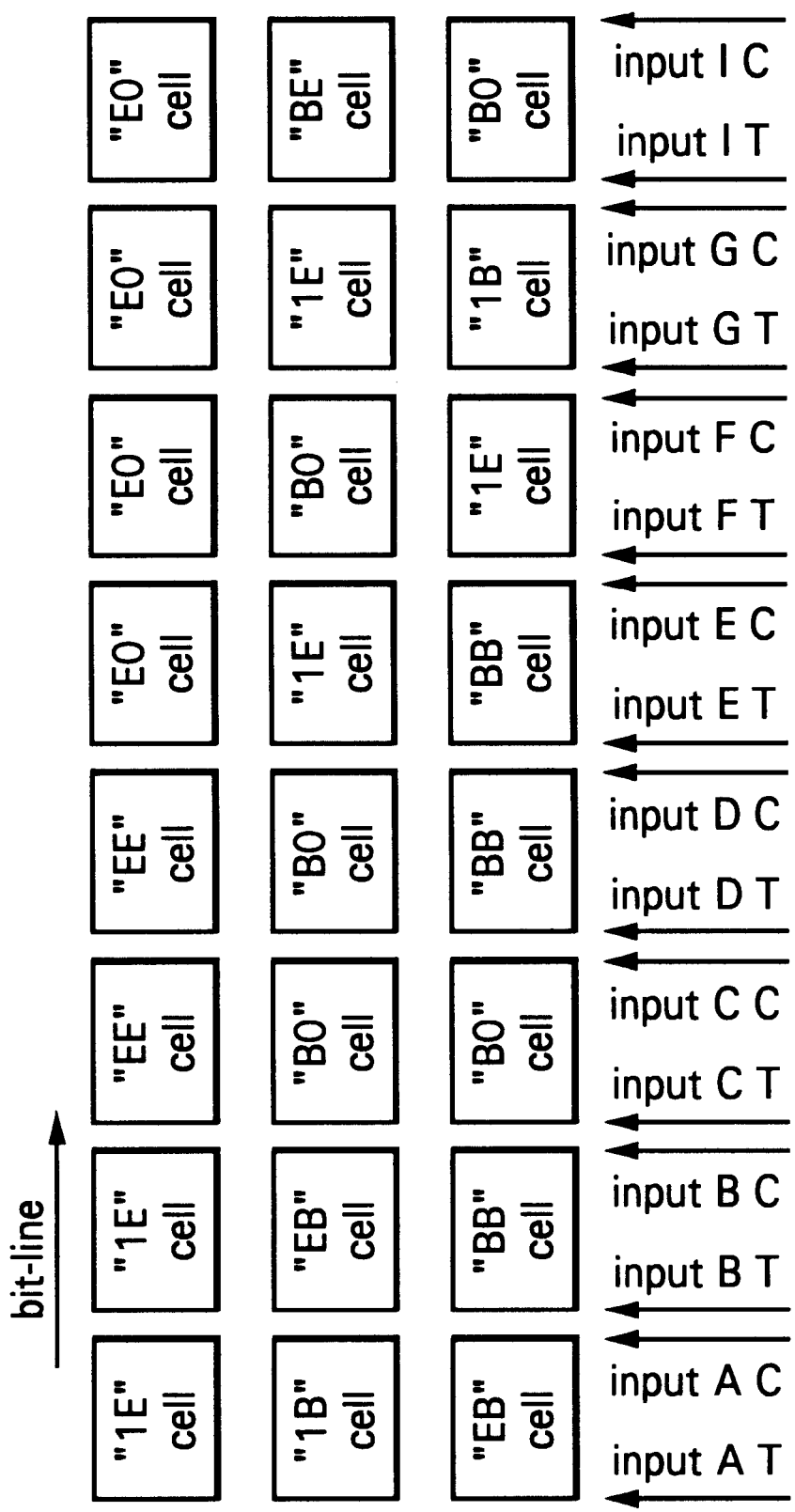
FIG. 9 is a cell map showing cells placed in accordance with the fourth embodiment of the invention.

Referring now to FIG. 9, the cells of FIG. 8 are applied to the logic of FIG. 6A. The device locations at the interconnect are fully populated and the balance cells and contribution cells are the same as depicted in FIG. 7, but with dummy cells available so that the mask may be redesigned to implement other logic equations while allowing for device load balancing.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the techniques of the present invention could be adapted to other logic arrays such as field programmable logic arrays. It is therefore contemplated that such modifications can be made without departing from the spirit or scope of the present invention as defined in the appended claims.

What is claimed is:

1. A method for balancing delays in a programmable logic array, having a plurality of array input signal lines, comprising the steps of:

determining that at least one first given array input signal line has a greater number of contribution devices attached than a second number of logic contribution devices attached to at least one other said array input signal line; and connecting at least one additional device as a loading device, responsive to said determining step, to said at least one other array input signal line, wherein the number of contribution devices attached to said at least one first given array input signal line and said at least one other array input signal line are equal for balancing delay caused by said greater number of contribution devices.

2. The method of claim 1, wherein said programmable logic array is a mask programmable logic array, further including a plurality of devices for use as said at least one loading device and said step of connecting comprises depositing at least one mask layer for coupling said at least one loading device to said at least one other array input signal line.

3. The method of claim 1, wherein said plurality of array input signal lines and said step of connecting comprises connecting a gate of at least one transistor to a given one of said array input signal lines, and all channel terminals of said at least one transistor are coupled to ground.

4. The method of claim 1, wherein said programmable logic array further includes a plurality of logic OR plane signal lines having one signal line per logic input and said step of connecting comprises connecting a gate of at least one transistor having a channel coupled to at least one of said logic OR plane signal lines, to a given one of said array input signal lines.

5. The method of claim 1, wherein said steps of determining and connecting are repeated until all of said array input signal lines have an equal number of devices attached.

6. The method of claim 1, wherein said step of determining determines a plurality of differences between the number of attached contribution devices attached to a most loaded array input signal line having the highest number of said attached contribution devices and another number of attached contribution devices attached to said at least one other array input signal line, and said step of connecting comprises connecting a plurality of devices to said at least one other array input signal line until all of said array input signal line have an equal number of devices attached.

7. The method of claim 1, wherein said plurality of array input signal lines further include a plurality of secondary logic plane input signal lines and said step of connecting comprises connecting a gate of at least one transistor to a given one of said secondary logic plane input signal lines, and a drain and a source of said at least one transistor are coupled to ground.

8. The method of claim 1, wherein said plurality of secondary logic plane input signal lines comprise complementary pairs of signal lines and said step of determining determines that at least one secondary logic plane input signal line has a greater number of attached contribution devices attached for each signal line in each of said complimentary pairs of signal lines.

9. The method of claim 8 wherein said complimentary pairs of signal lines comprise logic AND plane signal line pairs having two signal lines per logic input and said step of connecting comprises connecting one transistor to a signal line from at least one of said logic AND plane signal line pairs.

10. The method of claim 1, wherein said programmable logic array is a field programmable logic array, further including a plurality of devices for use as said at least one loading device and said step of connecting comprises programming said device for coupling said at least one loading device to said at least one other array input signal line.

11. The method of claim 1, further comprising providing a device at each interconnect junction of an interconnect matrix of said programmable logic array.

12. The method of claim 11, wherein said device is selected from the group consisting of:
a logic contribution cell;
a balance cell; and
a dummy cell.

13. A programmable logic array, comprising:
a plurality of inputs;
a plurality of logic gates having a plurality of logic gate inputs; and
a plurality of devices for coupling said inputs to said logic gate inputs and for loading said logic gate inputs, at least one of said devices coupling at least one of said logic gate inputs to at least one of said inputs when said at least one input forms part of a logic equation associated with said at least one logic gate input, at least one other device loading another input without coupling to any of said logic gate inputs to make the number of devices at each of said inputs equal.

14. The programmable logic array of claim 13, further comprising at least one mask layer for coupling said devices to said inputs.

15. The programmable logic array of claim 14, wherein said at least one mask layer further couples said devices to said logic gate inputs.

16. The programmable logic array of claim 13, wherein said devices are transistors and a gate of at least one of said transistors is coupled to said at least one input and all channel terminals of said at least one transistor are coupled to ground.

17. The programmable logic array of claim 13, wherein said plurality of logic gates comprises a plurality of OR gates having a single input line for each logic input.

18. The programmable logic array of claim 13, wherein said plurality of logic gates comprises a plurality of AND gates having two complementary input lines for each logic input.

19. The programmable logic array of claim 13, wherein said plurality of logic gates comprises a first plurality of OR gates having a single input line for each logic input and a second plurality of AND gates having two complementary input lines for each logic input.

20. The programmable logic array of claim 13, wherein said plurality of devices are utilized in a dynamic array operable in a asynchronous mode.

21. The programmable logic array of claim 13, wherein each of said plurality of devices is selected from the group consisting of:
a logic contribution cell;
a balance cell; and
a dummy cell.

22. The programmable logic array as recited in claim 13, further comprising an interconnect matrix wherein each interconnect junction of said interconnect matrix has an associated device.

23. A computer program product for use with a computer system comprising signal bearing media containing program instructions for execution on said computer system for configuring programmable logic by performing the steps of:
determining that at least one given array input signal line has a greater number of attached contribution devices attached than the number of contribution devices attached to another of said array input signal lines; and
connecting at least one additional device as a loading device, responsive to said determining step, to at least one other array input signal line having a lesser number of attached contribution devices to equalize the number of contribution devices attached to said at least one given array input signal line and said at least one other array input signal line.

24. The computer program product of claim 23, wherein said programmable logic is a programmable logic array and wherein said connecting step connects said at least one additional device by creating a mask.

25. The computer program product of claim 23, wherein said computer system is further connected to a field programmer, and said connecting step connects said at least one additional device by programming a field programmable logic array.

* * * * *